(12) United States Patent
Baek et al.

(10) Patent No.: US 10,867,639 B2
(45) Date of Patent: Dec. 15, 2020

(54) MEMORY DEVICE INCLUDING CHARGE PUMP CIRCUIT

(71) Applicant: Samsung Electronics Co., Ltd., Suwon-si (KR)

(72) Inventors: Se-heon Baek, Seoul (KR); Dae-seok Byeon, Seongnam-si (KR); Ki-chang Jang, Yongin-si (KR); Young-sun Min, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/502,736

(22) Filed: Jul. 3, 2019

(65) Prior Publication Data

US 2020/0111513 A1 Apr. 9, 2020

(30) Foreign Application Priority Data

Oct. 5, 2018 (KR) .......................... 10-2018-0119304

(51) Int. Cl.
| | | |
|---|---|---|
| *G11C 16/30* | (2006.01) | |
| *G11C 5/14* | (2006.01) | |
| *G11C 29/12* | (2006.01) | |
| *G11C 7/22* | (2006.01) | |
| *G11C 11/56* | (2006.01) | |
| *G11C 16/32* | (2006.01) | |

(52) U.S. Cl.
CPC .............. *G11C 5/145* (2013.01); *G11C 5/147* (2013.01); *G11C 7/222* (2013.01); *G11C 11/5621* (2013.01); *G11C 11/5671* (2013.01); *G11C 16/30* (2013.01); *G11C 16/32* (2013.01); *G11C 29/12005* (2013.01)

(58) Field of Classification Search
CPC ................................. G11C 16/10; G11C 16/26
USPC .......................................... 365/185.2, 185.24
See application file for complete search history.

(56) References Cited

U.S. PATENT DOCUMENTS

| | | | |
|---|---|---|---|
| 8,085,086 B1 * | 12/2011 | Lin | ....................... H02M 3/073 327/536 |
| 9,076,511 B2 | 7/2015 | Kim et al. | |
| 9,264,053 B2 | 2/2016 | Englekirk | |
| 9,698,676 B1 | 7/2017 | Huynh et al. | |
| 9,881,654 B2 | 1/2018 | Peng et al. | |

(Continued)

FOREIGN PATENT DOCUMENTS

KR      10-2014-0105091 A      9/2014

*Primary Examiner* — Michael T Tran
(74) *Attorney, Agent, or Firm* — Harness, Dickey & Pierce, P.L.C.

(57) ABSTRACT

The memory device includes a memory cell array including a plurality of memory cells and a voltage generator configured to supply a voltage to the memory cell array. The voltage generator includes a charge pump circuit, a switching circuit, and a stage controller. The charge pump circuit includes a plurality of pump units and is configured to output a pump voltage and a pump current in accordance with a number of pump units that have received an input voltage among the plurality of pump units. The switching circuit is configured to output the pump voltage. The stage controller is configured to receive an input signal corresponding to the pump current and perform a stage control operation of generating a stage control signal for controlling the number of pump units to be driven.

20 Claims, 11 Drawing Sheets

(56) References Cited

U.S. PATENT DOCUMENTS

| | | | |
|---|---|---|---|
| 2002/0008566 A1* | 1/2002 | Taito | G11C 5/145 327/536 |
| 2004/0080360 A1 | 4/2004 | Bedarida et al. | |
| 2005/0127981 A1* | 6/2005 | Lee | H03H 11/245 327/536 |
| 2006/0092703 A1* | 5/2006 | Chae | G11C 16/10 365/185.18 |
| 2007/0121388 A1* | 5/2007 | Lee | G11C 16/16 365/185.29 |
| 2007/0133318 A1* | 6/2007 | Min | G11C 8/08 365/189.09 |
| 2008/0205134 A1* | 8/2008 | Kato | H02M 3/07 365/185.2 |
| 2008/0247252 A1* | 10/2008 | Ruf | G11C 5/14 365/211 |
| 2008/0266956 A1* | 10/2008 | Byeon | G11C 16/10 365/185.09 |
| 2009/0034352 A1* | 2/2009 | Choy | G11C 5/145 365/226 |
| 2009/0073795 A1* | 3/2009 | Pyeon | G11C 5/145 365/228 |
| 2009/0108888 A1* | 4/2009 | Gebara | H02M 3/07 327/148 |
| 2009/0116292 A1* | 5/2009 | Maejima | G11C 16/0483 365/185.23 |
| 2010/0033232 A1 | 2/2010 | Pan | |
| 2011/0018615 A1 | 1/2011 | Pan | |
| 2011/0019495 A1* | 1/2011 | Scheuerlein | G11C 8/08 365/230.06 |
| 2011/0075484 A1* | 3/2011 | Lee | G11C 16/0408 365/185.17 |
| 2011/0133820 A1 | 6/2011 | Pan | |
| 2012/0140563 A1* | 6/2012 | Sung | G06F 1/10 365/185.18 |
| 2013/0064006 A1* | 3/2013 | Garg | G11C 8/16 365/154 |
| 2013/0070552 A1* | 3/2013 | Ryu | G11C 8/14 365/230.03 |
| 2013/0134957 A1* | 5/2013 | Hioka | G11C 16/0483 323/311 |
| 2013/0141982 A1* | 6/2013 | Park | G11C 16/16 365/185.19 |
| 2014/0153338 A1* | 6/2014 | Byeon | G11C 16/28 365/185.21 |
| 2015/0287479 A1* | 10/2015 | Nam | G11C 29/025 714/721 |
| 2015/0340097 A1* | 11/2015 | Kim | G11C 29/028 365/185.18 |
| 2016/0012890 A1* | 1/2016 | Park | G11C 11/5685 365/148 |
| 2016/0029129 A1* | 1/2016 | Nicollini | H04R 3/00 381/113 |
| 2016/0352217 A1 | 12/2016 | Reddy et al. | |
| 2017/0076800 A1* | 3/2017 | Musha | G11C 16/0483 |
| 2018/0123578 A1 | 5/2018 | Chauhan et al. | |
| 2018/0358101 A1* | 12/2018 | So | G06F 11/1008 |
| 2020/0185010 A1* | 6/2020 | Lo | G11C 5/148 |
| 2020/0211655 A1* | 7/2020 | Shibata | G11C 16/0483 |
| 2020/0241390 A1* | 7/2020 | Kwon | H02J 7/0068 |

* cited by examiner

MEMORY DEVICE INCLUDING CHARGE PUMP CIRCUIT

CROSS-REFERENCE TO RELATED APPLICATION

This application claims the benefit of Korean Patent Application No. 10-2018-0119304, filed on Oct. 5, 2018, in the Korean Intellectual Property Office, the disclosure of which is incorporated herein in its entirety by reference.

BACKGROUND

Some example embodiments of the inventive concepts relate to semiconductor devices, and more particularly, to memory devices including a charge pump circuit.

Recently, demands for highly integrated and large capacity non-volatile semiconductor memory devices are increasing. Flash memory mainly used in a portable electronic device is a representative example of such non-volatile semiconductor memory devices. In a program operation of the non-volatile memory device, a relatively high voltage is applied. In order to generate such a relatively high voltage, a voltage generator for raising an input voltage input to the non-volatile memory device to generate the relatively high voltage may be provided in the non-volatile memory device. The voltage generator may include a charge pump. The charge pump is a kind of a direct current (DC)-DC converter for generating a voltage higher than the input voltage or lower than a ground voltage.

SUMMARY

Some example embodiments of the inventive concepts provide memory devices including a charge pump circuit, capable of mitigating or preventing a large amount of peak current from being generated and/or reducing power consumed by the charge pump circuit.

According to an example embodiment of the inventive concepts, a memory device includes a memory cell array including a plurality of memory cells, and a voltage generator configured to supply a voltage to the memory cell array. The voltage generator may includes a charge pump circuit including n pump units and configured to output a pump voltage and a pump current in accordance with a number of pump units, among the n pump units, that have received an input voltage, n being a natural number equal to or greater than 2, a switching circuit configured to output the pump voltage, and a stage controller configured to receive an input signal corresponding to the pump current and perform a stage control operation, the stage control operation including generating a stage control signal, the stage control signal being a signal for controlling the number of pump units among the n pump units.

According to an example embodiment of the inventive concepts, a memory device includes a charge pump circuit including a plurality of pump units and configured to output a pump voltage and a pump current in accordance with a number of pump units that have received an input voltage among the plurality of pump units, a switching circuit configured to output the pump voltage and the pump current, and a stage controller configured to receive an input signal corresponding to the pump current from the switching circuit, and generate a stage control signal for controlling a stage of the charge pump circuit. The memory device may be configured to increase the number of pump units as the stage of the charge pump circuit increases.

According to an example embodiment of the inventive concepts, a memory device includes a charge pump circuit including a plurality of pump units and configured to output a pump voltage and a pump current, and a stage controller configured to perform a stage control operation of controlling a number of pump units to be driven among the plurality of pump units. The stage controller may include a pump current copy circuit configured to receive an input signal corresponding to the pump current and generate a copy voltage corresponding to the pump current, a pump current detector configured to output a reference signal based on the copy voltage and a reference voltage, and a stage control signal generator configured to generate a stage control signal for controlling a stage of the charge pump circuit based on the reference signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Some example embodiments of the inventive concepts will be described in detail with reference to the accompanying drawings.

It will be understood that, although the terms first, second, third etc. may be used herein to describe various values, elements, components, regions, layers and/or sections, these values, elements, components, regions, layers and/or sections should not be limited by these terms. These terms are only used to distinguish one value, element, component, region, layer or section from another value, element component, region, layer or section. Thus, a first value, element, component, region, layer or section discussed below could be termed a second value, element, component, region, layer or section without departing from the teachings of example embodiments.

Figure 1:
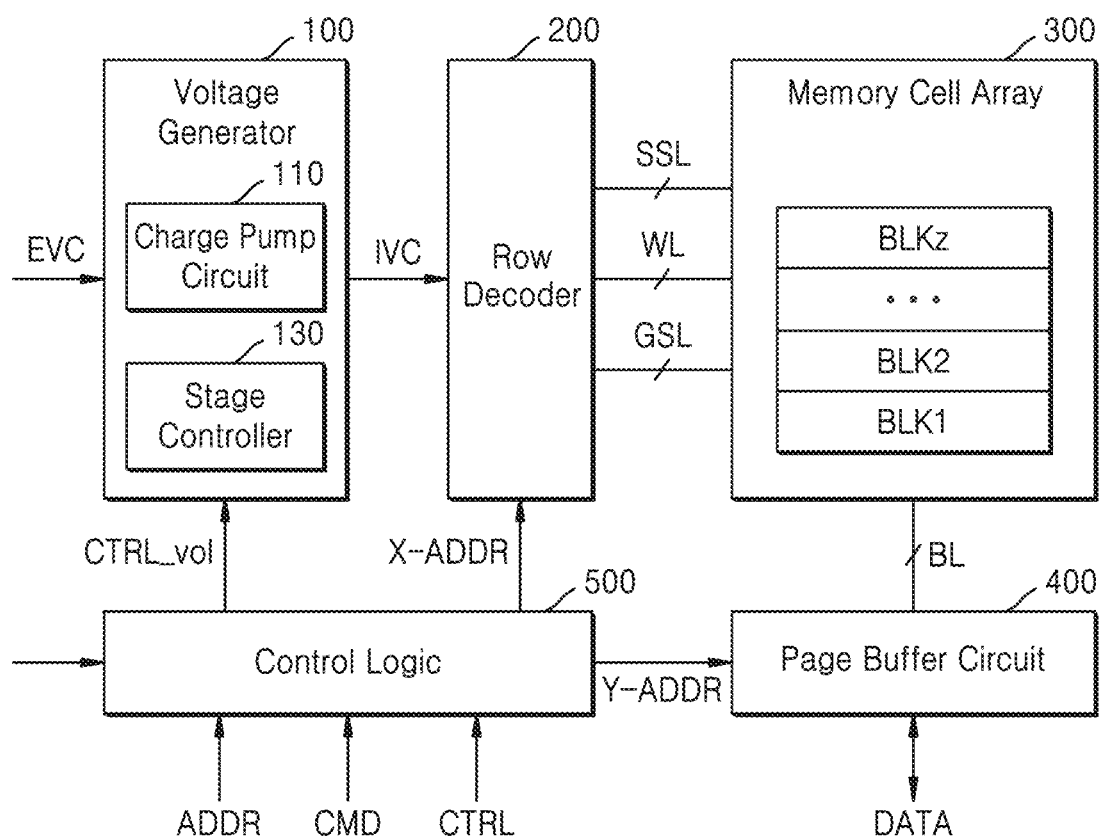
FIG. 1 is a block diagram illustrating a memory device including a charge pump circuit according to an example embodiment of the inventive concepts.

FIG. 1 is a block diagram illustrating a memory device 10 including a charge pump circuit according to an example embodiment of the inventive concepts.

The memory device 10 may be, for example, a NAND flash memory device. However, example embodiments of the inventive concepts are not limited to a NAND flash memory device. For example, the memory device 10 may include a NOR flash memory device, a resistive random access memory (RRAM) device, a phase-change random access memory (PRAM) device, a magneto-resistive random access memory (MRAM) device, a ferroelectric random access memory (FRAM) device, a spin transfer torque random access memory (STT-RAM) device, or the like. Further, according to some example embodiments, the memory device 10 may be implemented to have a three-dimensional array structure. For example, the memory device 10 may include a vertical NAND flash memory device having a three-dimensional array structure. The inventive concepts may be applied to a charge trap flash (CTF) memory device in which a charge storage layer includes an insulating layer as well as a flash memory device in which a charge storage layer is formed of a conductive floating gate.

Referring to FIG. 1, the memory device 10 includes a voltage generator 100, a row decoder 200, a memory cell array 300, a page buffer circuit 400, and a control logic 500. Although not shown in FIG. 1, the memory device 10 may further include a data input and output circuit or an input and output interface. Further, although not shown, the memory device 10 may further include various sub-circuits such as an error correction circuit for correcting an error of data read from the memory cell array 300.

The voltage generator 100 may receive an external voltage EVC provided from an external device (for example, a memory controller or a host). The voltage generator 100 may generate various kinds of internal voltages IVC for performing program, read, and erase operations on the memory cell array 300 from the external voltage EVC based on a voltage control signal CTRL_vol. For example, the voltage generator 100 may generate a word line voltage, a program voltage, a read voltage, a pass voltage, an erase verification voltage, or a program verification voltage. In addition, the voltage generator 100 may further generate a string selection line voltage and a ground selection line voltage based on the voltage control signal CTRL_vol. Further, the voltage generator 100 may further generate a bit line voltage based on the voltage control signal CTRL_vol.

The voltage generator 100 may include a charge pump circuit 110 and a stage controller 130. The charge pump circuit 110 may receive the external voltage EVC provided from the external device and may generate a pump voltage from the external voltage EVC. The charge pump circuit 110 may include first to nth pump units each receiving the external voltage EVC. According to a stage of the charge pump circuit 110, the number of pump units that receive the external voltage EVC among the first to nth pump units may vary. For example, in a first stage, one pump unit may receive the external voltage EVC and, at a second stage, two pump units may receive the external voltage EVC. In other words, the term "stage" or "stage of the charge pump circuit" may refer to the number of pump unit to be driven among the first to nth pump units.

The stage controller 130 may control a stage of the charge pump circuit 110 based on a magnitude of a pump current generated by the charge pump circuit 110. In FIG. 1, it is illustrated that the stage controller 130 is included in the voltage generator 100. However, the memory devices 10 according to the inventive concepts are not limited thereto. For example, the stage controller 130 may be included in the control logic 500.

The voltage generator 100 of the memory device 10 according to some example embodiments of the inventive concepts may include the charge pump circuit 110 and the stage controller 130. Therefore, it is possible to prevent a large amount of peak current from being generated during an operation by controlling the stage of the charge pump circuit 110. Further, the voltage generator 100 of the memory device 10 may control the stage of the charge pump circuit 110 by sensing the pump current output from the charge pump circuit 110. Thus, power consumption may be reduced when the operation is performed and/or an operation speed may be increased.

The row decoder 200 may select one of memory blocks BLK1 to BLKz in response to a row address X-ADDR. The row decoder 200 may select one of word lines WL of a selected memory block and may select one of a plurality of string selection lines SSL. Further, the row decoder 200 receives the internal voltage IVC from the voltage generator 100 and may transmit a voltage for performing a memory operation to the word lines WL of the selected memory block. For example, during an erase operation, the row decoder 200 may transmit an erase voltage and a verification voltage to the selected word line and may transmit a pass voltage to non-selected word lines.

The memory cell array 300 may include a plurality of memory cells. For example, the plurality of memory cells included in the memory cell array 300 may be non-volatile memory cells that maintain stored data although supplied power is blocked. The memory cell array 300 may be connected to the string selection lines SSL, the word lines WL, ground selection lines GSL, and bit lines BL. For example, the memory cell array 300 may be connected to the row decoder 200 through the string selection lines SSL, the word lines WL, and the ground selection lines GSL, and further may be connected to the page buffer circuit 400 through the bit lines BL.

The memory cell array 300 includes the plurality of memory blocks BLK1 to BLKz. Each of the plurality of memory blocks BLK1 to BLKz may have a planar structure or a three-dimensional structure. The memory cell array 300 may include at least one of a single level cell block including single level cells SLC, a multilevel cell block including multilevel cells MLC, a triple level cell block including triple level cells TLC, and a quad level cell block including quad level cells QLC. For example, some memory blocks of the plurality of memory blocks BLK1 to BLKz may be single level cell blocks and the other memory blocks may be multilevel cell blocks, triple level cell blocks, or quad level cell blocks.

The page buffer circuit 400 may transmit data DATA to and receive data DATA from the outside of the memory device 10. The page buffer circuit 400 may select some of the bit lines BL in response to a column address Y-ADDR. The page buffer circuit 400 may operate as a write driver or a sense amplifier.

The control logic 500 may output various control signals, for example, the voltage control signal CTRL_vol, the row address X-ADDR, and the column address Y-ADDR for programming the data DATA in the memory cell array 300, reading the data DATA from the memory cell array 300, or erasing the data DATA stored in the memory cell array 300 based on a command CMD, an address ADDR, and a control signal CTRL. For example, the control logic 500 may receive the command CMD, the address ADDR, and the control signal CTRL from the memory controller outside the memory device 10. Therefore, the control logic 500 may entirely control various operations in the memory device 10.

Figure 2:
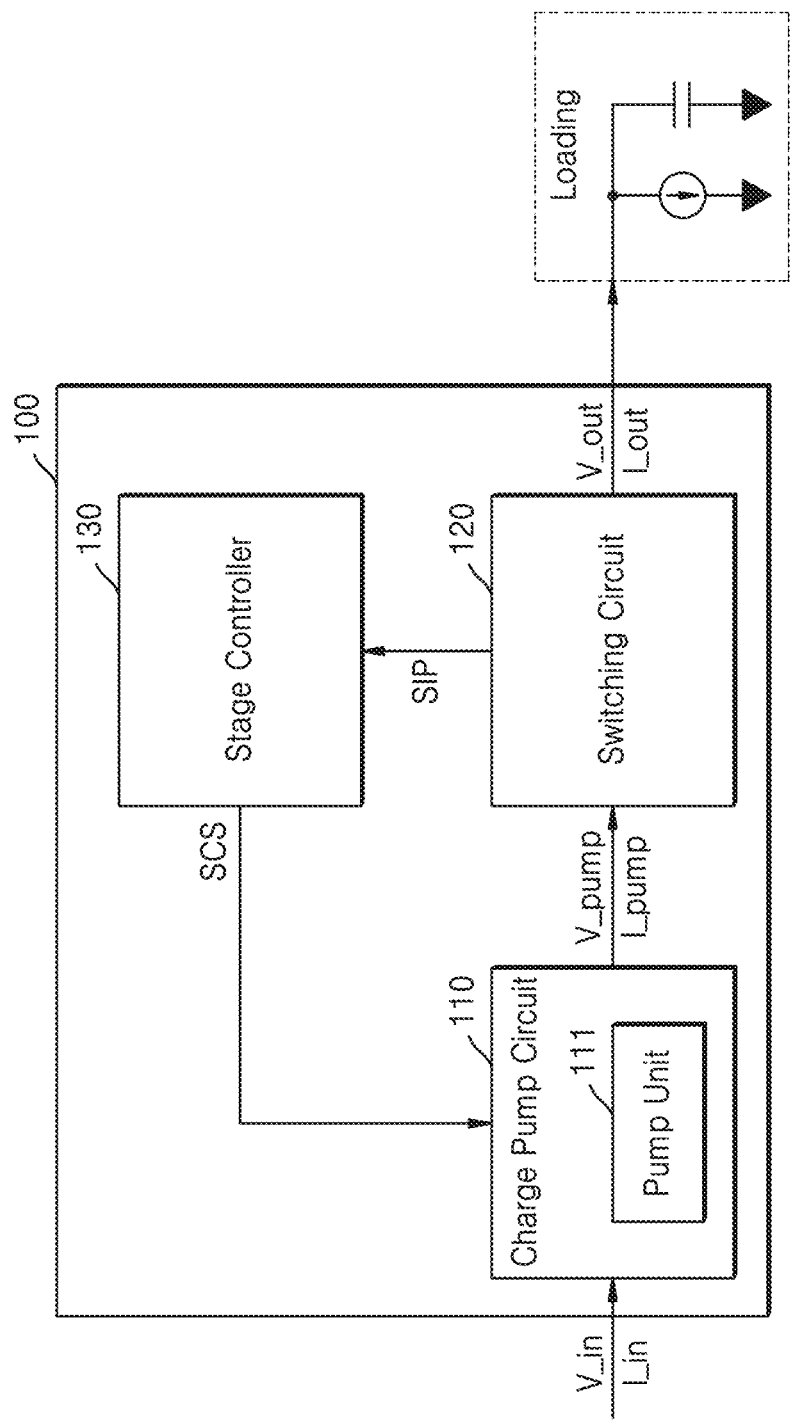
FIG. 2 is a block diagram illustrating a voltage generator of a memory device according to an example embodiment of the inventive concepts.

FIG. 2 is a block diagram illustrating a voltage generator of a memory device according to an example embodiment of the inventive concepts.

Referring to FIG. 2, the voltage generator 100 may include the charge pump circuit 110, a switching circuit 120, and the stage controller 130. The charge pump circuit 110 may include a plurality of pump units 111.

An input voltage V_in and an input current I_in may be provided from the outside to the charge pump circuit 110. At this time, the input voltage V_in may be the external voltage EVC of FIG. 1. The charge pump circuit 110 may output a pump voltage V_pump by raising the input voltage V_in. At this time, the charge pump circuit 110 may generate a pump current I_pump to output the pump voltage V_pump.

In the charge pump circuit 110, in accordance with a received stage control signal SCS, an operating stage may change. The input voltage V_in may be applied to each of the plurality of pump units 111. In accordance with the stage of the charge pump circuit 110, the number of pump units, to which the input voltage V_in is applied, among the plurality of pump units 111 may vary. That is, in accordance with the stage of the charge pump circuit 110, the number of pump units that operate among the plurality of pump units 111 may vary. For example, in the first stage, one pump unit operates, and at the second stage, two pump units may operate.

The switching circuit 120 may output the pump voltage V_pump output from the charge pump circuit 110 to the outside as an output voltage V_out. For example, the switching circuit 120 may receive the control signal (for example, CTRL_vol of FIG. 1) from the control logic (for example, 500 of FIG. 1), and may output the pump voltage V_pump as the output voltage V_out. At this time, the switching circuit 120 may generate an output current I_out to output the output voltage V_out.

When the memory device starts one operation among the program operation, the read operation, and the erase operation, in order to charge cells included in the memory cell array 300, the output voltage V_out and the output current I_out may be output to the outside of the voltage generator 100. For example, the charged memory cells may be expressed as a capacitor. When a charging operation of the charge pump circuit 110 is completed. Accordingly, the charge pump circuit 110 reaches a stabilization process, the output voltage V_out may reach a target voltage, and thus the output current I_out may be reduced and stabilized to a certain value.

The stage controller 130 may receive a signal SIP corresponding to the pump current I_pump from the switching circuit 120. The stage controller 130 may obtain information on a magnitude of the pump current I_pump from the signal SIP corresponding to the pump current I_pump. The stage controller 130 may control the stage of the charge pump circuit 110 based on the information on the magnitude of the pump current I_pump. The stage controller 130 may output the stage control signal SCS to the charge pump circuit 110 based on the information on the magnitude of the pump current I_pump. A configuration of the stage controller 130 will be described hereinafter with reference to FIG. 5.

Figure 3:
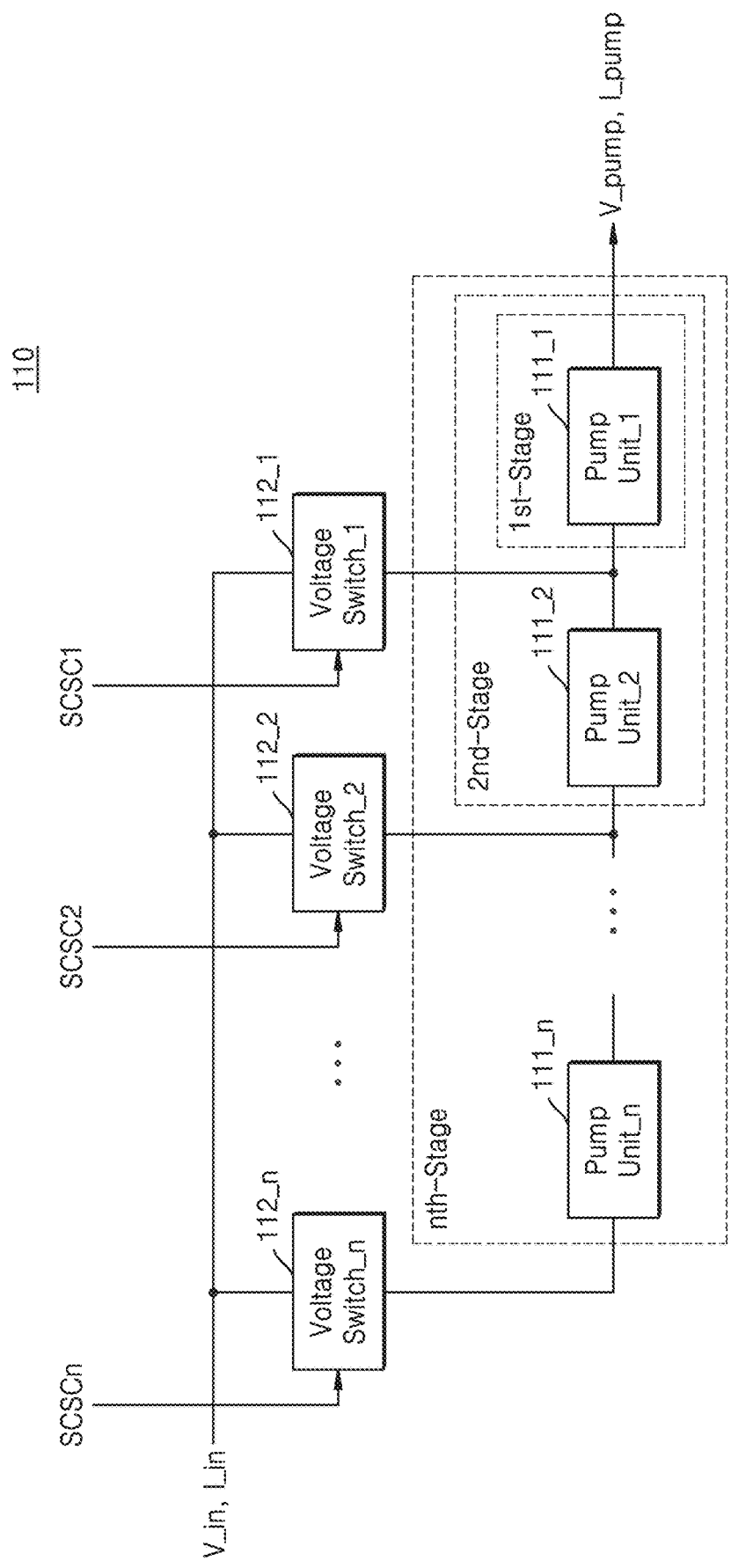
FIG. 3 is a block diagram illustrating a charge pump circuit according to an example embodiment of the inventive concepts.

FIG. 3 is a block diagram illustrating a charge pump circuit 110 according to an example embodiment of the inventive concepts.

Referring to FIGS. 2 and 3, the charge pump circuit 110 may include first to nth pump units 111_1 to 111_n and first to nth voltage switches 112_1 to 112_n. At this time, n is a natural number equal to or greater than 3. The first to nth pump units 111_1 to 111_n may be continuously connected. An internal configuration of each of the first to nth pump units 111_1 to 111_n will be described in FIG. 4.

The first to nth voltage switches 112_1 to 112_n may be selectively switched on/off, and accordingly, the input voltage V_in may be applied to the pump units respectively according to switching operations of the first to nth voltage switches 112_1 to 112_n. Corresponding switching signals SCSC1 to SCSCn may be respectively applied to the first to nth voltage switches 112_1 to 112_n, and accordingly on/off operations of the first to nth voltage switches 112_1 to 112_n may be controlled. At this time, in accordance with the stage control signal SCS received from the stage controller 130, the switching signals SCSC1 to SCSCn respectively provided to the first to nth voltage switches 112_1 to 112_n may change.

In an example embodiment, the stage control signal SCS may be formed of n-bit codes SCSC1 to SCSCn, and the bits may correspond to different voltage switches among the first to nth voltage switches 112_1 to 112_n, respectively. For example, in the stage control signal SCS, the first code SCSC1 may be provided to the first voltage switch 112_1, the second code SCSC2 is provided to the second voltage switch 112_2, and the nth code SCSCn may be provided to the nth voltage switch 112_n.

In an example embodiment, the stage control signal SCS is not formed of the n-bit codes, and instead may include a stage up signal for increasing the stage of the charge pump circuit 110 and a stage down signal for reducing or decreasing the stage of the charge pump circuit 110. The charge pump circuit 110 may increase the number of pump units that operate when the stage up signal is received, and may reduce the number of pump units that operate when the stage down signal is received.

In the charge pump circuit 110, in accordance with the received stage control signal SCS, an operating stage may change. In accordance with the stage of the charge pump circuit 110, the number of pump units, to which the input voltage V_in is applied, among the first to nth pump units 111_1 to 111_n, may vary. For example, in the first stage, the input voltage V_in is applied to the first pump unit 111_1, and accordingly one pump unit may be driven. At the second stage, the input voltage V_in is applied to the first pump unit 111_1 and the second pump unit 111_2, and accordingly two pump units may be driven. In the nth stage, the input voltage V_in is applied to the first to nth pump units 111_1 to 111_n, and accordingly n pump units may be driven.

As the number of driving pump units increases, the charge pump circuit 110 may generate a relatively higher voltage as a target level while outputting a large amount of pump current I_pump. Therefore, as the number of driving pump units increases, the time spent on the pump voltage V_pump for reaching the target level (for example, set up time) may be reduced.

On the other hand, as the number of driving pump units increases, power consumed by the charge pump circuit 110 may increase. Further, as the number of driving pump units increases, a peak value of the input current I_in input to the charge pump circuit 110 may increase. Therefore, an operation of a component that provides power to the memory device may become unstable and the input voltage V_in provided to the memory device may become unstable.

In the memory device according to some example embodiments of the inventive concepts, the number of driving pump units among the first to nth pump units 111_1 to 111_n included in the charge pump circuit 110 may be controlled in accordance with the stage control signal SCS, Thus, an operation speed may be increased by reducing or preventing power consumption and/or the setup time from excessively increasing.

Figure 4:
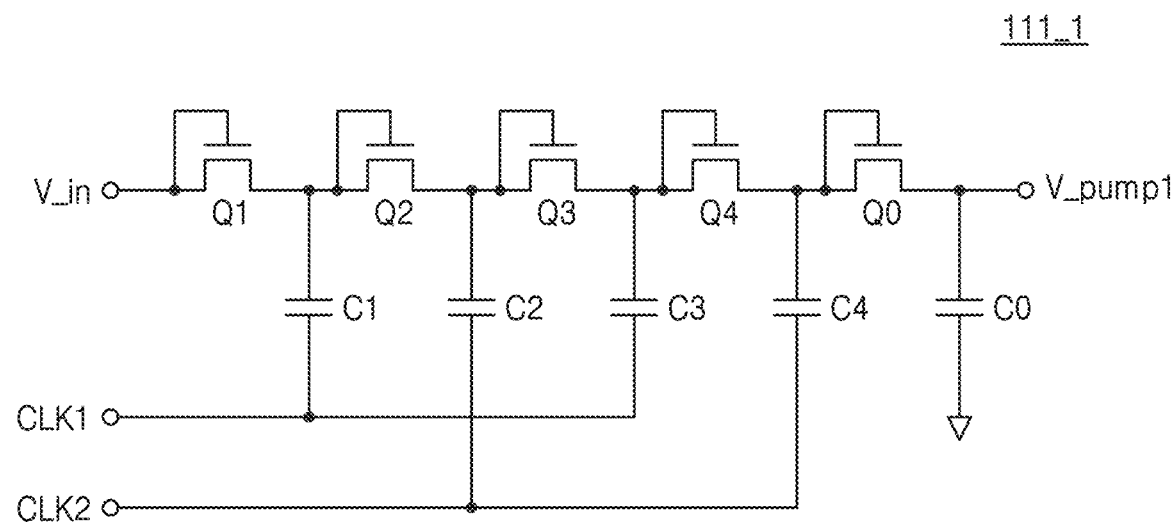
FIG. 4 is a block diagram illustrating a pump unit according to an example embodiment of the inventive concepts.

FIG. 4 is a block diagram illustrating a pump unit according to an example embodiment of the inventive concepts. FIG. 4 illustrates the first pump unit 111_1 of FIG. 3 in a case where the input voltage V_in is provided to the first pump unit 111_1. The pump unit illustrated in FIG. 4 is merely an example. The pump unit may be implemented in one of various forms different from the one illustrated in FIG. 4. In FIG. 4, the first pump unit 111_1 of FIG. 3 is illustrated. The same configuration may be applied to the second to nth pump units 111_2 to 111_n of FIG. 3.

Referring to FIG. 4, the first pump unit 111_1 may include a plurality of transistors Q0 to Q4 and a plurality of capacitors C0 to C4. The plurality of transistors Q0 to Q4 may include n-type metal-oxide-semiconductor (NMOS) transistors. Drain terminals of the transistors Q0 to Q4 and gate terminals of the transistors Q0 to Q4 are connected to each other, respectively, and may operate as diodes. In FIG. 4, it is illustrated that the first pump unit 111_1 includes the five transistors Q0 to Q4 and the five capacitors C0 to C4. However, pump units according to the inventive concepts are not limited thereto. The number of transistors and capacitors may vary.

A first clock signal CLK1 or a second clock signal CLK2 may be input through the first to fourth capacitors C1 to C4 excluding the output capacitor C0 connected to an output end. In an example embodiment, the first clock signal CLK1 and the second clock signal CLK2 may be complementary.

In a first half period, the first clock signal CLK1 has a low level and the second clock signal CLK2 may have a high level and the first capacitor C1 may be charged by the input voltage V_in. In the next half period, the first clock signal CLK1 has a high level and the second clock signal CLK2 may have a low level and a voltage of the first capacitor C1 may be increased (or boosted) to two times the input voltage V_in by the first clock signal CLK1. Further, the first transistor Q1 is turned off and the second transistor Q2 is turned on, and accordingly a voltage of the second capacitor C2 may increase twice the input voltage V_in.

In the next half period, when it is set again that the first clock signal CLK1 has a low level and the second clock signal CLK2 has a high level, a voltage of a second capacitor C2 is increased to three times the input voltage V_in by the second clock signal CLK2 and a third capacitor C3 may be charged by the voltage of the second capacitor C2. Through such an operation, a first pump voltage V_pump1 may be generated by amplifying the input voltage V_in. That is, when the number of transistors included in the first pump unit 111_1 is i, the first pump voltage V_pump1 may be amplified up to i times the input voltage V_in.

Figure 5:
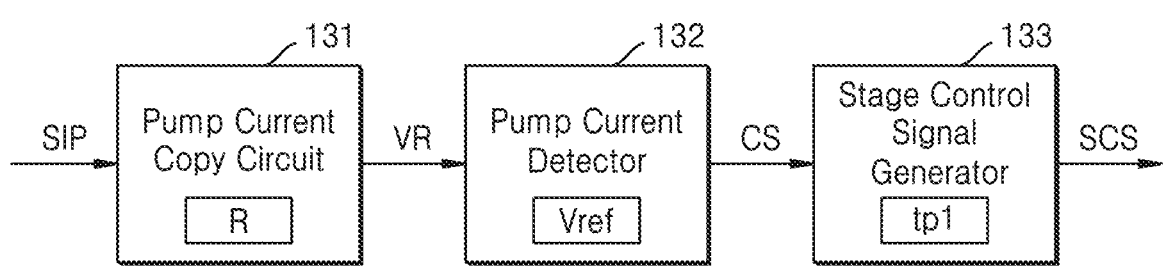
FIG. 5 is a block diagram illustrating a stage controller according to an example embodiment of the inventive concepts.

FIG. 5 is a block diagram illustrating a stage controller 130 according to an example embodiment of the inventive concepts.

Referring to FIGS. 2 and 5, the stage controller 130 may include a pump current copy circuit 131, a pump current detector 132, and a stage control signal generator 133.

The pump current copy circuit 131 may receive the signal SIP corresponding to the pump current I_pump from the switching circuit 120. The pump current copy circuit 131 may generate a copy voltage VR, a magnitude of which corresponds to the magnitude of the pump current I_pump, based on the signal SIP that corresponds to the pump current I_pump. In an example embodiment, the pump current copy circuit 131 may include a current mirror circuit and a current-voltage conversion circuit. For example, the current-voltage conversion circuit of the pump current copy circuit 131 may include a variable resistor R and a magnitude of the copy voltage VR may be proportional to a magnitude of the variable resistor R.

The pump current detector 132 may receive the copy voltage VR output from the pump current copy circuit 131. The pump current detector 132 may generate a reference signal CS based on the copy voltage VR with a reference voltage Vref. For example, the pump current detector 132 may compare the copy voltage VR with a reference voltage Vref, and generate a reference signal CS based on a comparison result. In such cases, the reference signal CS may be referred to as a comparison signal. In an example embodiment, the pump current detector 132 may be implemented by an analog-digital converter (ADC). At this time, the reference voltage Vref may be provided from outside or may be generated in the pump current detector 132.

For example, the pump current detector 132 may output the reference signal CS at a first level (for example, a high level) when the copy voltage VR is greater than the reference voltage Vref, and may output the reference signal CS at a second level (for example, a low level) when the copy voltage VR is less than or equal to the reference voltage Vref. Operations of the pump current detector 132 according to the inventive concepts are not limited thereto. The reference signal CS at the low level may be output when the copy voltage VR is greater than the reference voltage Vref, and the reference signal CS at the high level may be output when the copy voltage VR is less than or equal to the reference voltage Vref.

In an example embodiment, the pump current detector 132 may generate the reference signal CS based on the copy voltage VR and a plurality of reference voltages (for example, Vref1 and Vref2). For example, the pump current detector 132 may compare the copy voltage VR with a plurality of reference voltages (for example, Vref1 and Vref2) and generate the reference signal CS based on results of the comparison. In such cases, the reference signal CS may be referred to as a comparison signal.

The stage control signal generator 133 may receive the reference signal CS from the pump current detector 132, and may output the stage control signal SCS. At this time, an operation of the stage control signal generator 133 outputting the stage control signal SCS may vary in accordance with an operation period. A control operation of the stage controller 130 may be divided into an operation in a first period P1 and an operation in a second period P2 based on a previously designated first reference time tp1 (see FIG. 6). In an example embodiment, the charge pump circuit 110 performs an operation of charging memory cells in the first period, and may finish the charging operation in the second period.

In an example embodiment, after an operation of the memory device starts, in the first period in which the memory cells are charged, the stage control signal generator 133 may output the stage control signal SCS that increases a stage when the reference signal CS is transitioned from the first level (for example, the high level) to the second level (for example, the low level). On the other hand, in the second period after the first period (for example, after tp1 of FIG. 6), the stage control signal generator 133 may output the stage control signal SCS that reduces the stage when the reference signal CS is transitioned from the second level to the first level.

In an example embodiment, the stage control signal generator 133 may receive information on the first reference time tp1 that is a point in time at which the second period starts from the outside. For example, data corresponding to the first reference time tp1 may be stored in the stage control signal generator 133, and based on the previously stored data on the first reference time tp1, the operation of the first period and the operation of the second period may be dividedly performed. In an example embodiment, the stage control signal generator 133 may detect the first reference time tp1 that is a point in time at which the second period starts. For example, the stage control signal generator 133 may obtain the first reference time tp1 by detecting a point in time at which the charge pump circuit (e.g., charge pump circuit 110 of FIG. 3) reaches a maximum stage (e.g., an nth stage). Operations of the stage control signal generator 133 according to the inventive concepts may not be limited thereto.

According to the foregoing example embodiment, the memory device may change the stage of the charge pump circuit based on the magnitude of the pump current I_pump output from the charge pump circuit. Therefore, the memory device may increase the pump current I_pump by sensing the case in which the magnitude of the pump current I_pump is not large enough and increasing the stage. Further, the memory device may control the stage (e.g., the maximum number of stages) after checking the magnitude of the pump current I_pump so as not to operate at a undesirably high stage from a point in time at which an operation of a charge pump circuit generating the pump voltage V_pump starts. Thus, power consumption may be reduced. The memory device may reduce power consumption by reducing the stage (e.g., the maximum number of stages) of the charge pump circuit in the second period.

Figure 6:
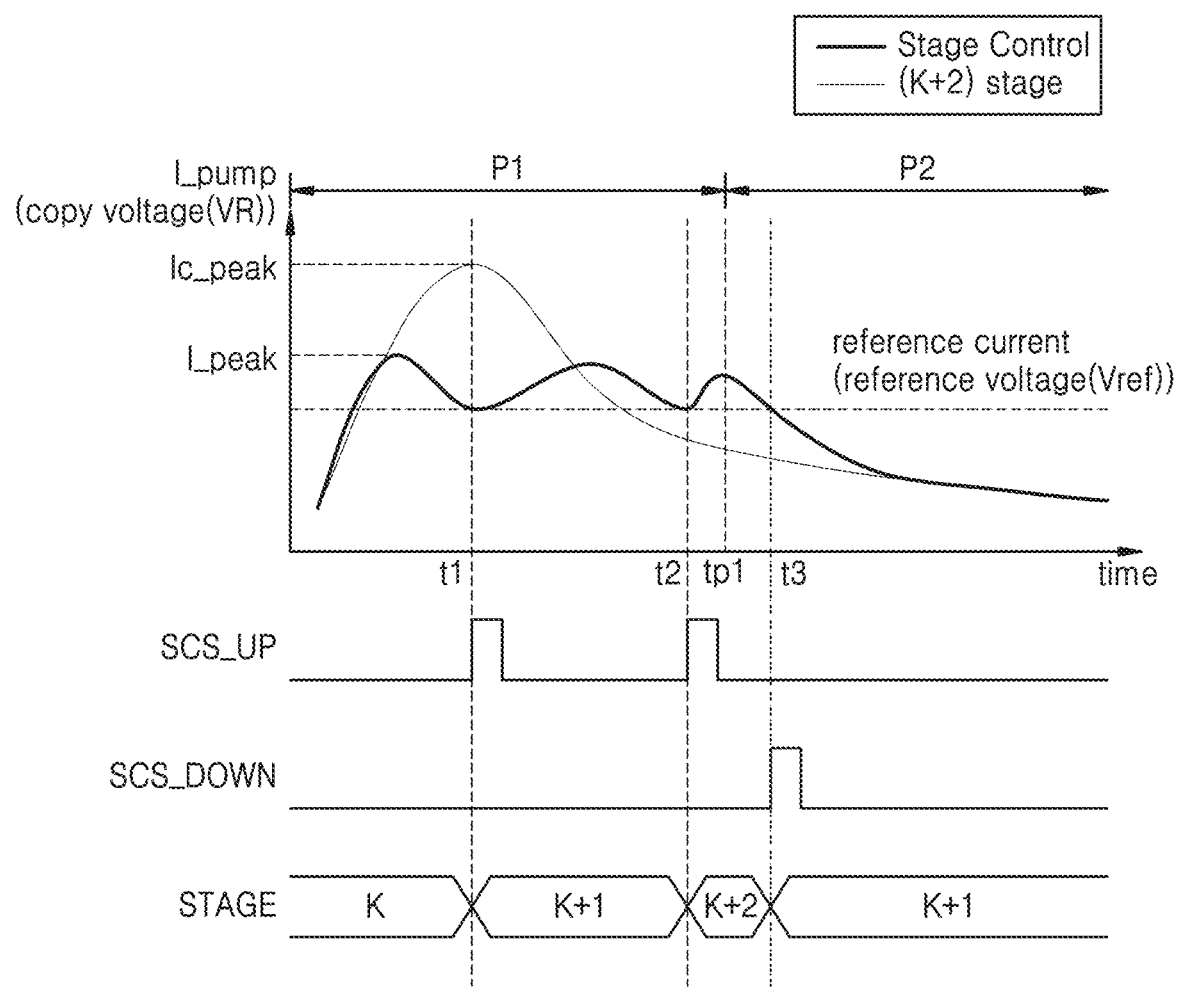
FIG. 6 is a view illustrating an operation of a stage controller according to an example embodiment of the inventive concepts.

FIG. 6 is a view illustrating an operation of a stage controller according to an example embodiment of the inventive concepts. FIG. 6 is a view illustrating a change in stage in accordance with the magnitude of the pump current and includes a graph illustrating a change in pump current over time. The charge pump circuit according to a comparative example operates at a (K+2)th stage without a change in stage. The operation of the stage controller illustrated in FIG. 6 is merely an example, and operations of the stage controller according to the inventive concepts are not limited thereto.

Referring to FIGS. 2, 5, and 6, when the charge pump circuit 110 according to an example embodiment of the inventive concepts starts to operate, the charge pump circuit 110 may operate at a previously determined K stage. At this time, K may be an arbitrary number, which is a natural number equal to or greater than 1 as.

The stage controller 130 may control the stage of the charge pump circuit 110. An operation of controlling the stage controller 130 may be divided into an operation in the first period P1 and an operation in the second period P2 based on the first reference time tp1. The charge pump circuit 110 may perform an operation of charging memory cells in the first period P1, and may finish the charging operation in the second period P2.

Data corresponding to the first reference time tp1 may be previously stored in the stage controller 130. In some example embodiments, the stage controller 130 may detect the first reference time tp1. The stage controller 130 may output the stage control signal SCS based on the first reference time tp1. In an example embodiment, the stage control signal SCS may include a stage up signal SCS_UP and a stage down signal SCS_DOWN, and the stage controller 130 may output the stage up signal SCS_UP in the first period P1, and may output the stage down signal SCS_DOWN in the second period P2.

When the charge pump circuit 110 starts to operate, the magnitude of the pump current I_pump may increase to a magnitude of a peak current I_peak. In the charge pump circuit 110 according to an example embodiment, K pump units may operate, and in a charge pump circuit according to the comparative example, (K+2) pump units may operate. Thus, the magnitude of the peak current I_peak of the charge pump circuit 110 according to the example embodiment may be less than a magnitude of a peak current Ic_peak of the charge pump circuit according to the comparative example. Therefore, according to the example embodiment, it is possible to prevent a device outside the memory device from being damaged due to the undesirably high peak current generated in the memory device according to the comparative example, thereby stably providing the input voltage to the memory device.

The magnitude of the pump current I_pump is gradually reduced after the magnitude of the pump current I_pump reaches the magnitude of the peak current I_peak, and may reach a magnitude of a reference current at a first time t1. At the first time t1, the pump current copy circuit 131 may generate the copy voltage VR corresponding to the magnitude of the pump current I_pump based on the signal SIP that corresponds to the pump current I_pump. At this time, the magnitude of the copy voltage VR may be equal to a magnitude of the reference voltage Vref. Because the copy voltage VR is gradually reduced and reaches the reference voltage Vref, the pump current detector 132 may output the reference signal CS transitioning from the high level to the low level. The stage control signal generator 133 may receive the reference signal CS transitioning from the high level to the low level, and may output the stage up signal SCS_UP for increasing the stage. The charge pump circuit 110 may receive the stage up signal SCS_UP, and may operate at a (K+1)th stage. As the stage of the charge pump circuit 110 increases, the magnitude of the pump current I_pump may increase again to a certain magnitude.

The magnitude of the pump current I_pump may be reduced again, and reach the magnitude of the reference current at a second time t2. The pump current copy circuit 131 may generate the copy voltage VR corresponding to the magnitude of the pump current I_pump based on the signal SIP that corresponds to the pump current I_pump. At the second time t2, the magnitude of the copy voltage VR may be equal to the magnitude of the reference voltage Vref. Because the copy voltage VR is gradually reduced and reaches the reference voltage Vref, the pump current detector 132 may output the reference signal CS transitioning from the high level to the low level. The stage control signal generator 133 may receive the reference signal CS, and may output the stage up signal SCS_UP for increasing the stage. The charge pump circuit 110 may receive the stage up signal SCS_UP, and may operate at the (K+2)th stage. As the stage of the charge pump circuit 110 increases, the magnitude of the pump current I_pump may increase again to a certain magnitude. Because the charge pump circuit 110 performs the charging operation in the first period P1, the stage controller 130 may control a magnitude of the pump current I_pump to be equal to or larger than a magnitude of the reference current, and may reduce a setup time spent on the pump voltage V_pump reaching a target voltage.

At a third time t3 in the second period P2, the magnitude of the pump current I_pump is reduced again, and may reach the magnitude of the reference current. The pump current copy circuit 131 may generate the copy voltage VR, a magnitude of which corresponds to the magnitude of the pump current I_pump based on the signal SIP that corresponds to the pump current I_pump. At the third time t3, the magnitude of the copy voltage VR may be equal to the magnitude of the reference voltage Vref. Because the copy voltage VR is gradually reduced and reaches the reference voltage Vref, the pump current detector 132 may output the reference signal CS transitioning from the low level to the high level. The stage control signal generator 133 may receive the reference signal CS, and may output the stage down signal SCS_DOWN for reducing the stage. The charge pump circuit 110 may receive the stage down signal SCS_DOWN, and may operate at the (K+1)th stage. Because the charging operation of the charge pump circuit 110 is finished in the second period, the number of driving pump units engaging the charging operation may be reduced, thereby reducing power consumption.

Figure 7:
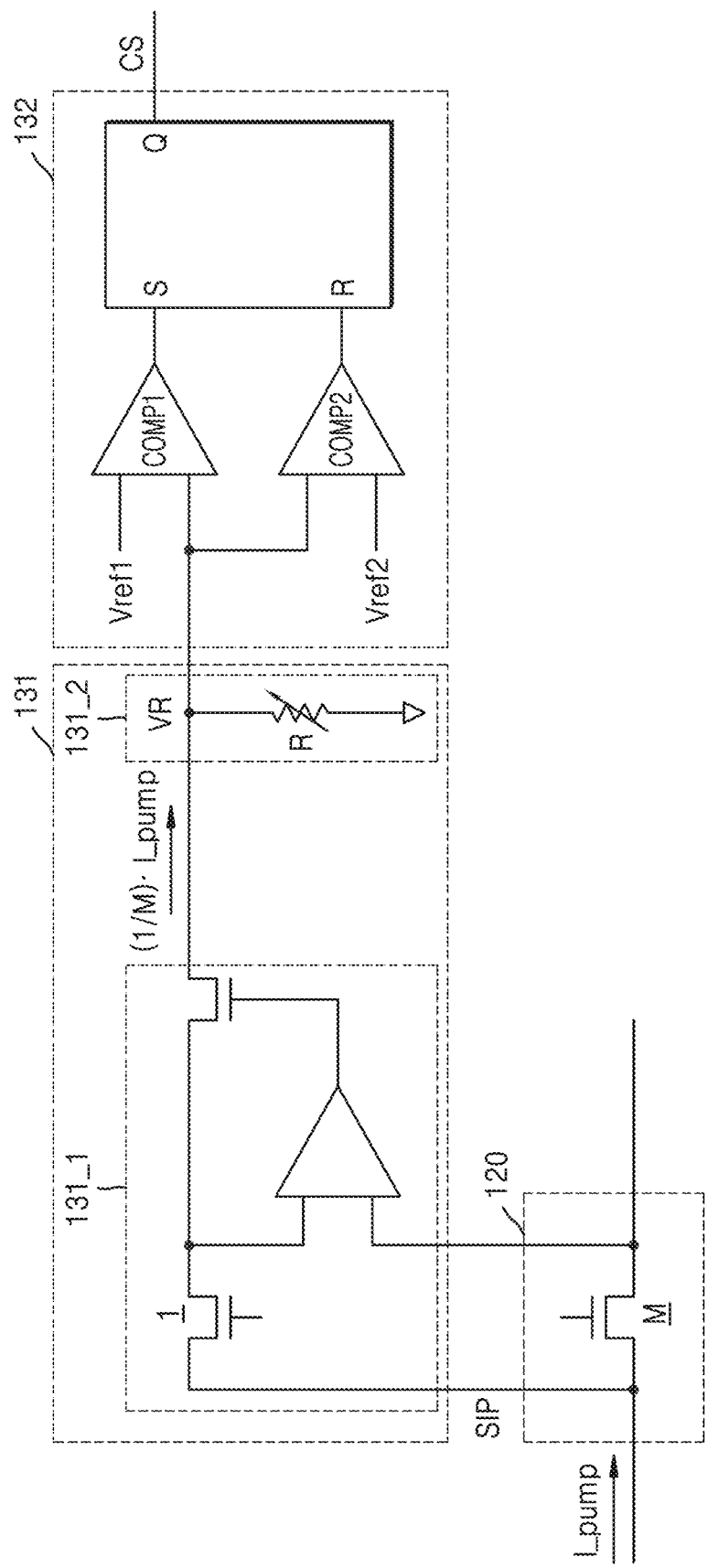
FIG. 7 is a circuit diagram illustrating a switching circuit, a pump current copy circuit, and a pump current detector that are included in a voltage generator according to an example embodiment of the inventive concepts.

FIG. 7 is a circuit diagram illustrating a switching circuit, a pump current copy circuit, and a pump current detector that are included in a voltage generator according to an example embodiment of the inventive concepts. The circuit diagram of FIG. 7 is an example configuration corresponding to the operation of the stage controller in FIG. 6. Therefore, voltage generators according to the inventive concepts are not limited thereto, and various circuit configurations are available.

Referring to FIGS. 5 and 7, the switching circuit 120 may include a plurality of transistors. For example, the switching circuit 120 may include M transistors. At this time, M may be a natural number equal to or greater than 2.

The pump current copy circuit 131 may include a current mirror circuit 131_1 and a current-voltage conversion circuit 131_2. The current mirror circuit 131_1 may receive the signal SIP that corresponds to the pump current I_pump, decrease the pump current I_pump by M times, and copy the pump current I_pump decreased by M times. The current-voltage conversion circuit 131_2 may convert the copied current 1/M·I_pump into the copy voltage VR.

The current mirror circuit 131_1 may be connected to both ends of the switching circuit 120, and may receive a voltage between the both ends of the switching circuit 120 as the signal SIP corresponding to the pump current I_pump. In an example embodiment, the current mirror circuit 131_1 may include two transistors and one operation amplifier. A configuration of the current mirror circuit is not limited thereto. The current mirror circuit 131_1 may have one of various circuit configurations in which the pump current I_pump is decreased by M times, and the current 1/M·I_pump may be output.

Figure 10:
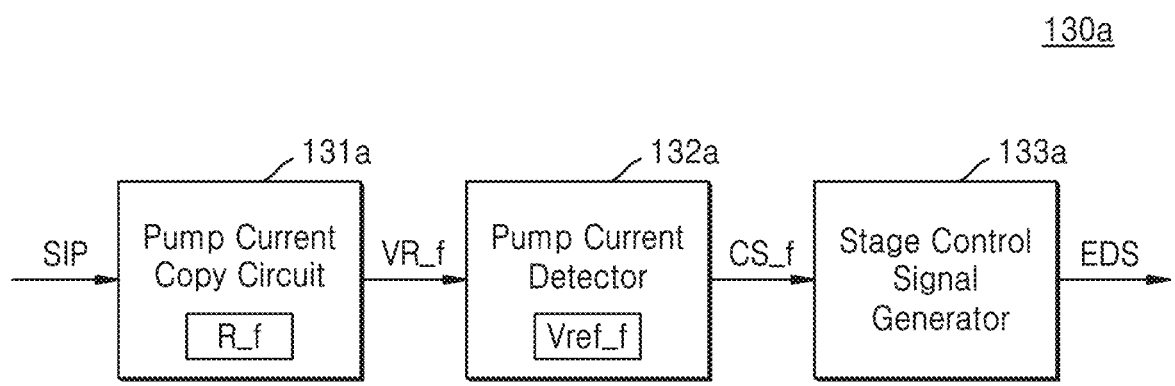
FIG. 10 is a block diagram illustrating a stage controller according to an example embodiment of the inventive concepts.

In an example embodiment, the current-voltage conversion circuit 131_2 may be implemented by the variable resistor R connected to a ground power source. A magnitude of the variable resistor R may vary in accordance with control of the control logic (e.g., control logic 500 of FIG. 1). For example, the magnitude of the variable resistor R may be controlled in order to compensate for an offset of the current mirror circuit 131_1. In some example embodiments, for example, as illustrated in FIG. 10, the magnitude of the variable resistor R may be controlled in order to detect a defective memory cell included in the memory cell array (e.g., memory cell array 300 of FIG. 1).

In an example embodiment, the pump current detector 132 may be implemented by an ADC. For example, the pump current detector 132 may include two comparators COMP1 and COMP2 and an S-R latch.

The copy voltage VR and the first reference voltage Vref1 may be input to the first comparator COMP1 and the copy voltage VR and the second reference voltage Vref2 may be input to the second comparator COMP2. At this time, one of the first reference voltage Vref1 and the second reference voltage Vref2 may be greater than the reference voltage Vref of FIG. 5 by the offset, and the other of the first reference voltage Vref1 and the second reference voltage Vref2 may be less than the reference voltage Vref of FIG. 5 by the offset. For example, the first reference voltage Vref1 may be greater than the reference voltage Vref by the offset and the second reference voltage Vref2 may be less than the reference voltage Vref by the offset.

The first comparator COMP1 may output a high-level signal when the copy voltage VR is greater than the first reference voltage Vref1, and may output a low-level signal when the copy voltage VR is less than the first reference voltage Vref1. The second comparator COMP2 may output a low-level signal when the copy voltage VR is greater than the second reference voltage Vref2, and may output a high-level signal when the copy voltage VR is less than the second reference voltage Vref2.

The S-R latch may receive the signals output from the first comparator COMP1 and the second comparator COMP2, and may output the reference signal CS. For example, when the S-R latch receives the low-level signal from the first comparator COMP1 and receives the high-level signal from the second comparator COMP2, that is, when the copy voltage VR is less than the second reference voltage Vref2, the S-R latch may output the low-level reference signal CS. When the S-R latch receives the high-level signal from the first comparator COMP1 and receives the low-level signal from the second comparator COMP2, that is, when the copy voltage VR is greater than the first reference voltage Vref1, the S-R latch may output the high-level reference signal CS. When the S-R latch receives the low-level signal from the first comparator COMP1 and receives the low-level signal from the second comparator COMP2, that is, when the copy voltage VR is less than the first reference voltage Vref1 and is greater than the second reference voltage Vref2, the S-R latch may output the reference signal CS at the same level as a level of the previously output reference signal CS.

Therefore, the pump current detector 132 may output the low-level reference signal CS when the copy voltage VR is less than the second reference voltage Vref2, may output the high-level reference signal CS when the copy voltage VR is greater than the first reference voltage Vref1, and may output the reference signal CS at the same level as the level of the previously output reference signal CS when the copy voltage VR has a value between the first reference voltage Vref1 and the second reference voltage Vref2. In an example embodiment, the stage control signal generator 133 may output the stage control signal SCS when the reference signal CS transitions from the high level to the low level.

The pump current detector 132 illustrated in FIG. 7 includes the two comparators COMP1 and COMP2, and accordingly a change by a certain offset from the reference voltage Vref may not be sensed. The pump current detector 132 according to an example embodiment may include one comparator. The copy voltage VR and the reference voltage Vref may be inputted to the comparator. Thus, when the copy voltage VR is greater than the reference voltage Vref, the reference signal CS may have the high level, and when the copy voltage VR is less than the reference voltage Vref, the reference signal CS may have the low level.

Figure 8:
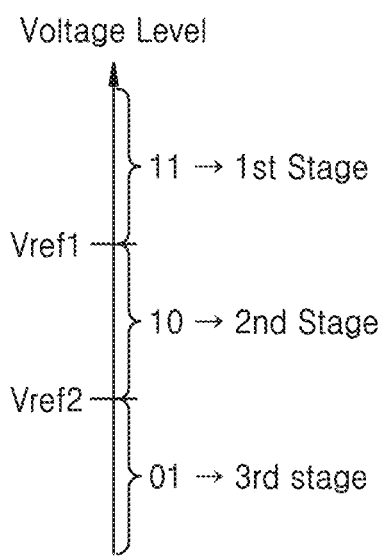
FIG. 8 is a view illustrating an operation of a stage controller according to an example embodiment of the inventive concepts.

FIG. 8 is a view illustrating an operation of a stage controller according to an example embodiment of the inventive concepts.

Referring to FIGS. 5 and 8, the pump current detector 132 may receive the copy voltage VR as an analog signal, and may generate the reference signal CS based on the copy voltage VR and the plurality of reference voltages Vref1 and Vref2. In FIG. 8, the two reference voltages are illustrated. However, pump current detectors according to an example embodiment of the inventive concepts may compare the copy voltage VR with three or more reference voltages.

For example, the pump current detector 132 may receive the copy voltage VR, and may output the 2-bit reference signal CS. When the copy voltage VR is greater than the first reference voltage Vref1, the pump current detector 132 may output the reference signal CS of 11. When the copy voltage VR is less than the second reference voltage Vref2, the pump current detector 132 may output the reference signal CS of 01. When the copy voltage VR has a value between the first reference voltage Vref1 and the second reference voltage Vref2, the pump current detector 132 may output the reference signal CS of 10.

In the first period before the first reference time tp1, the stage control signal generator 133 may generate the stage control signal SCS, and accordingly the charge pump circuit (e.g., charge pump circuit 110 of FIG. 2) may operate at the first stage when the reference signal CS of 11 is received. In the first period, the stage control signal generator 133 may generate the stage control signal SCS, and accordingly the charge pump circuit 110 may operate at the second stage when the reference signal CS of 10 is received. Further, in the first period, the stage control signal generator 133 may generate the stage control signal SCS, and accordingly the charge pump circuit 110 may operate at a third stage when the reference signal CS of 01 is received. That is, the stage corresponding to the magnitude of the copy voltage VR in the first period may be previously determined.

The stage controller 130 according to an example embodiment of the inventive concepts may control the stage by one of various methods other than the configuration illustrated in FIGS. 7 and 8 in accordance with the magnitude of the copy voltage VR corresponding to the pump current.

Figure 9:
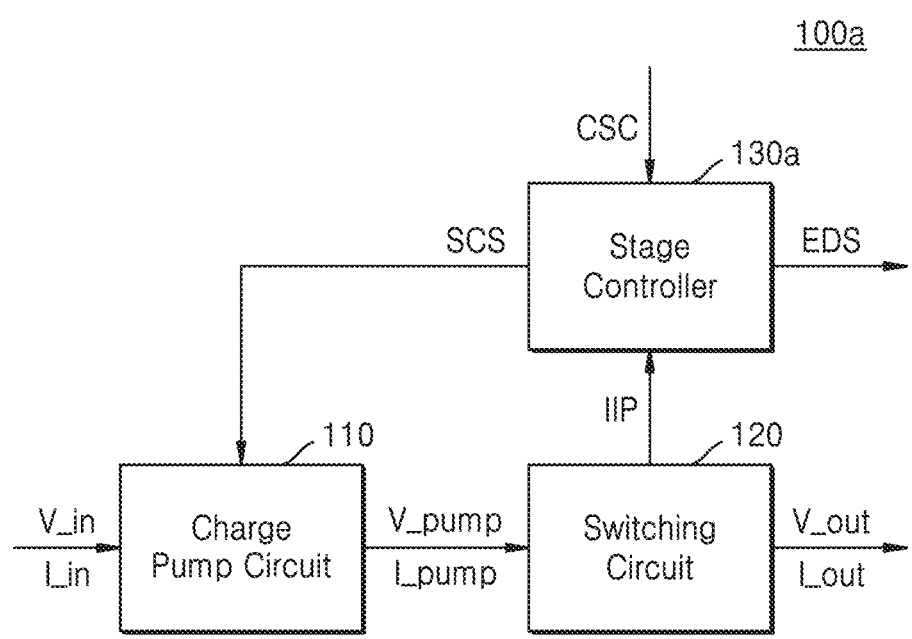
FIG. 9 is a block diagram illustrating a voltage generator of a memory device according to an example embodiment of the inventive concepts.

FIG. 9 is a block diagram illustrating a voltage generator 100a of a memory device according to an example embodiment of the inventive concepts. In FIG. 9, description of the same components as those of FIG. 2 will not be repeated.

Referring to FIG. 9, the voltage generator 100a may include the charge pump circuit 110, the switching circuit 120, and a stage controller 130a. The charge pump circuit 110 may include a plurality of pump units 111 (e.g., 111_1 to 111_n). The number of driving pump units may vary in accordance with the stage.

The stage controller 130a may terminate a stage control operation in response to a stage controller control signal CSC received from the outside. In an example embodiment, when an operation (e.g., one of a program operation, a read operation, and an erase operation)for the memory cells is completed, the stage controller 130a may receive the stage controller control signal CSC, the stage control operation on the charge pump circuit may be terminated, thereby reducing power consumption.

In an example embodiment, in response to the stage controller control signal CSC received from the outside, the stage controller 130a may terminate the stage control operation, and may perform an error detection operation with regard to one of the memory cell array and the voltage generator. The stage control operation of the stage controller 130a may be the same as the stage control operation of the stage controller 130 of FIG. 2. In an example embodiment, when the operation is performed on the memory cells, the stage controller control signal CSC may be received, and the stage controller 130a may perform the error detection operation. The stage controller control signal CSC may be included in the voltage control signal CTRL_vol of FIG. 1. The stage controller 130a may receive the signal SIP corresponding to the pump current I_pump from the switching circuit 120. The stage controller 130a may obtain information on the magnitude of the pump current I_pump from the signal SIP corresponding to the pump current I_pump.

The stage controller 130a may determine that an error is generated when the magnitude of the pump current I_pump is greater than the magnitude of the reference current. For example, when a fail memory cell is included in the memory cells on which the one operation among the program operation, the read operation, and the erase operation is performed, the magnitude of the pump current I_pump may be greater than the magnitude of the reference current, and the stage controller 130a may determine that the error is generated. Further, for example, when a loss current is generated by a defective transistor included in the charge pump circuit 110 or the switching circuit 120, the magnitude of the pump current I_pump may be greater than the magnitude of the reference current, and the stage controller 130a may determine that the error is generated.

When the error is detected, the stage controller 130a may output an error detection signal EDS to the control logic (e.g., control logic 500 of FIG. 1). In an example embodiment, the control logic 500 may receive the error detection signal EDS, may determine that the fail memory cell is included in the operating memory cells, and may process a memory block including the fail memory cell as a bad block. A configuration of the stage controller 130a will be described in FIG. 10.

Figure 11:
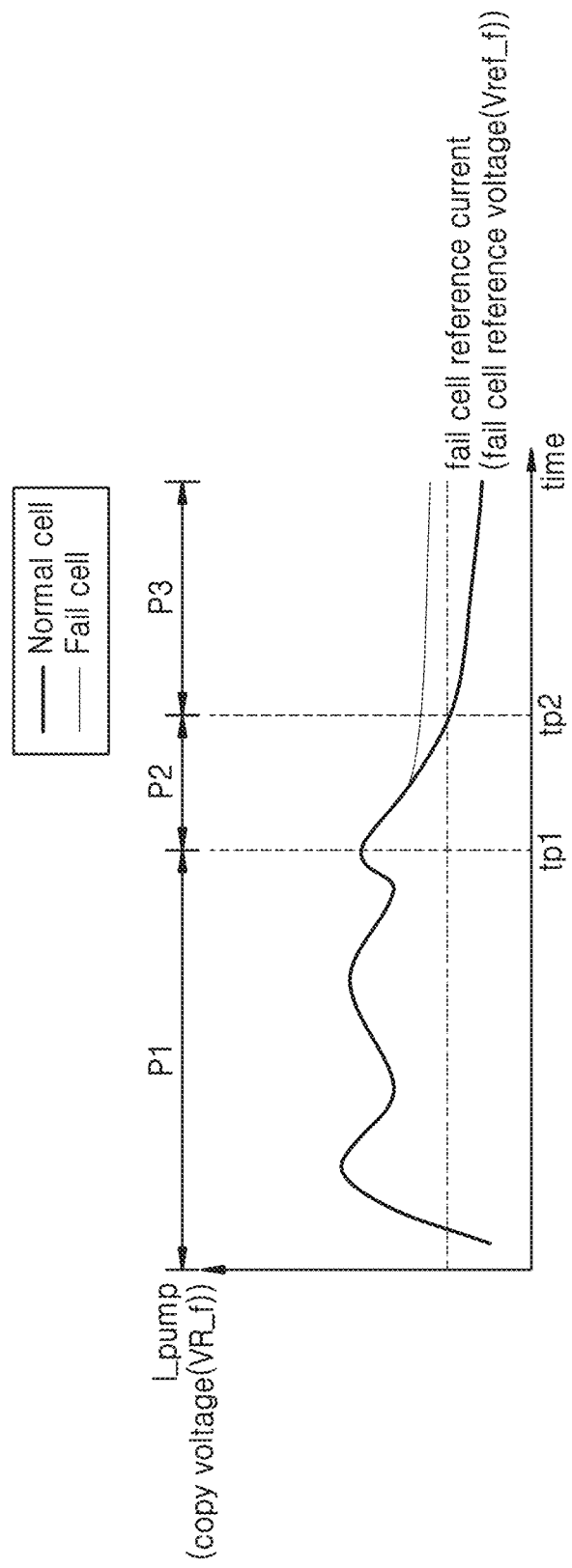
FIG. 11 is a view illustrating an operation of a stage controller according to an example embodiment of the inventive concepts.

FIG. 10 is a block diagram illustrating a stage controller according to an example embodiment of the inventive concepts. FIG. 11 is a view illustrating an operation of a stage controller according to an example embodiment of the inventive concepts. FIG. 10 is a view illustrating that the stage controller performs the error detection operation in a third period P3. FIG. 11 is a graph illustrating a change in pump current over time when the program operation is performed on normal memory cells and is the same as the graph of FIG. 6, which illustrates a change in pump current over time when the stage is controlled in accordance with the magnitude of the pump current. In FIG. 11, the case in which the memory device performs the program operation is described as an example. However, the same description may be applied when the read operation or the erase operation is performed.

Referring to FIGS. 9 to 11, the stage controller 130a may include a pump current copy circuit 131a, a pump current detector 132a, and a stage control signal generator 133a. When the program operation is performed on the memory cells, at a second reference time tp2, the stage controller 130a may receive the stage controller control signal CSC. In response to the stage controller control signal CSC, the stage controller 130a may perform the error detection operation in the third period P3 after the second reference time tp2.

When the error is not detected, the magnitude of the pump current I_pump in the third period P3 may be less than the magnitude of the pump current I_pump in another period, and may be stabilized. For example, when the fail memory cell is not included in the programmed memory cells, the magnitude of the pump current I_pump may be reduced, and may be stabilized. On the other hand, when the fail memory cell is included in the programmed memory cells, the leakage current may be generated, and accordingly the magnitude of the pump current I_pump may be greater than in the case in which the error is not detected. In FIG. 11, only the case in which the fail memory cell is included is illustrated. However, the inventive concepts are not limited thereto. For example, when a defective transistor is included in the switching circuit, the loss current is generated, and accordingly the magnitude of the pump current I_pump may be greater than in the case in which the error is not detected. The pump current copy circuit 131a may receive the signal SIP corresponding to the pump current I_pump from the switching circuit 120. The pump current copy circuit 131a may generate a copy voltage VR_f, a magnitude of which corresponds to the magnitude of the pump current I_pump based on the signal SIP corresponding to the pump current I_pump.

In an example embodiment, the pump current copy circuit 131a may include the current mirror circuit and the current-voltage conversion circuit, and the current-voltage conversion circuit may be implemented by a variable resistor R_f connected to the ground power source. After the stage control operation, when the error detection operation starts, a magnitude of the variable resistor R_f of the pump current copy circuit 131a may increase. That is, in response to the stage controller control signal CSC, a magnitude of the variable resistor R_f included in the pump current copy circuit 131a may increase.

The magnitude of the pump current I_pump when the stage controller 130a performs the error detection operation (e.g., in the third period P3) may be less than the magnitude of the pump current I_pump when the stage controller 130a performs the stage control operation (e.g., in the first period P1 and the second period P2). Therefore, when the stage controller 130a performs the error detection operation, the magnitude of the variable resistor of the pump current copy circuit 131a may increase, and accordingly the pump current detector 132a may easily detect the copy voltage VR_f.

The pump current detector 132a may receive the copy voltage VR_f output from the pump current copy circuit 131a. The pump current detector 132a may generate a reference signal CS_f based on the copy voltage VR_f with the reference voltage Vref_f. For example, the pump current detector 132a may compare the copy voltage VR_f with the reference voltage Vref_f, and may generate a reference signal CS_f based on a comparison result. Because the magnitude of the pump current I_pump when the stage controller 130a performs the error detection operation (e.g., in the third period P3) is less than the magnitude of the pump current I_pump when the stage controller 130a performs the stage control operation (e.g., in the first period P1 and the second period P2), the reference voltage Vref_f when the error detection operation is performed may be lower than the reference voltage when the stage control operation is performed. Accordingly, the copy voltage VR_f may be easily detected. At this time, a value of the reference voltage Vref_f may be a voltage value corresponding to a maximum value of the magnitude of the pump current I_pump after the normal memory cells are programmed. The reference voltage Vref_f may be provided from the outside or may be generated in the pump current detector 132a.

For example, the pump current detector 132a may output the high-level reference signal CS_f when the copy voltage VR_f is higher than the reference voltage Vref_f, and may output the low-level reference signal CS_f when the copy voltage VR_f is equal to or lower than the reference voltage Vref_f Operations of the pump current detector 132a according to the inventive concepts are not limited thereto. When the copy voltage VR_f is higher than the reference voltage Vref_f, the low-level reference signal CS_f may be output and, when the copy voltage VR_f is equal to or lower than the reference voltage Vref_f, the high-level reference signal CS_f may be output.

The stage control signal generator 133a may receive the reference signal CS_f from the pump current detector 132a, and may output the error detection signal EDS. For example, when the copy voltage VR_f is higher than the reference voltage Vref_f, the stage control signal generator 133a may receive the high-level reference signal CS_f, and may output the error detection signal EDS to the control logic (e.g., control logic 500 of FIG. 1).

In FIG. 10, as the stage controller 130a performs the error detection operation, the magnitude of the variable resistor R_f included in the pump current copy circuit 131a increases and a magnitude of the reference voltage Vref_f in the pump current detector 132a is reduced. However, the inventive concepts are not limited thereto. In some example embodiments, as the stage controller 130a performs the error detection operation, the magnitude of the variable resistor R_f included in the pump current copy circuit 131a reduces and the magnitude of the reference voltage Vref_f in the pump current detector 132a may be increased.

Figure 12:
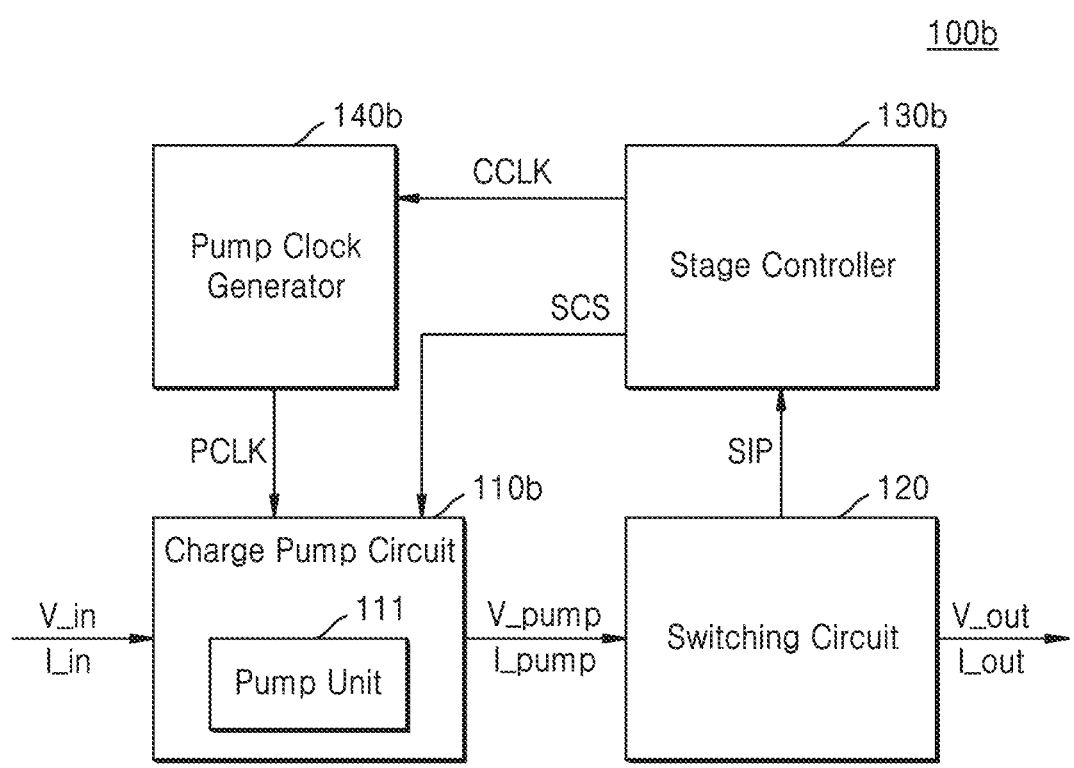
FIG. 12 is a block diagram illustrating a voltage generator of a memory device according to an example embodiment of the inventive concepts.

FIG. 12 is a block diagram illustrating a voltage generator 100b of a memory device according to an example embodiment of the inventive concepts. In FIG. 12, description of the same components as those of FIG. 2 will not be repeated.

Referring to FIG. 12, the voltage generator 100b may include the charge pump circuit 110b, the switching circuit 120, a stage controller 130b, and a pump clock generator 140b. The charge pump circuit 110b may include the plurality of pump units 111. The inventive concepts are not limited to FIG. 12. The stage controller 130b and the pump clock generator 140b may be components of the memory device and the voltage generator 100b.

The stage controller 130b may receive the signal SIP corresponding to the pump current I_pump from the switching circuit 120. The stage controller 130b may obtain the information on the magnitude of the pump current I_pump from the signal SIP corresponding to the pump current I_pump.

The stage controller 130b may control the stage of the charge pump circuit 110b based on the information on the magnitude of the pump current I_pump. The stage controller 130b may output the stage control signal SCS to the charge pump circuit 110b based on the information on the magnitude of the pump current I_pump. Further, the stage controller 130b may control a frequency of a pump clock signal PCLK provided to the charge pump circuit 110b based on the information on the magnitude of the pump current I_pump. The stage controller 130b may output a clock control signal CCLK to the pump clock generator 140b based on the information on the magnitude of the pump current I_pump. In an example embodiment, a stage control signal generator (not shown) included in the stage controller 130b may output the clock control signal CCLK to the pump clock generator 140b based on the information on the magnitude of the pump current I_pump.

The pump clock generator 140b may generate the pump clock signal PCLK, and may provide the pump clock signal PCLK to the charge pump circuit 110b. For example, the pump clock signal PCLK may include the first clock signal CLK1 and the second clock signal CLK2 of FIG. 4.

In an example embodiment, the pump clock generator 140b may be an oscillator. The pump clock generator 140b may receive the clock control signal CCLK from the stage controller 130b, and generate the frequency of the pump clock signal PCLK in accordance with the clock control signal CCLK. For example, the pump clock generator 140b may generate the pump clock signal PCLK having the frequency increased or reduced integer number times from a basic frequency in accordance with the clock control signal CCLK.

As the frequency of the pump clock signal PCLK increases, the charge pump circuit 110b may generate the high voltage at the target level while outputting the large amount of pump current I_pump. Therefore, as the number of driving pump units increases, the setup time spent on the pump voltage V_pump reaching the target level may be reduced. On the other hand, as the frequency of the pump clock signal PCLK increases, power consumption of the charge pump circuit 110b may increase.

According to the example embodiments, the memory device may control the stage of the charge pump circuit 110b and the pump clock signal PCLK provided to the charge pump circuit 110b by sensing the pump current I_pump. Thus, it is possible to mitigate or prevent power consumption or the setup time from excessively increasing. Thus, an operation speed may increase.

Figure 13:
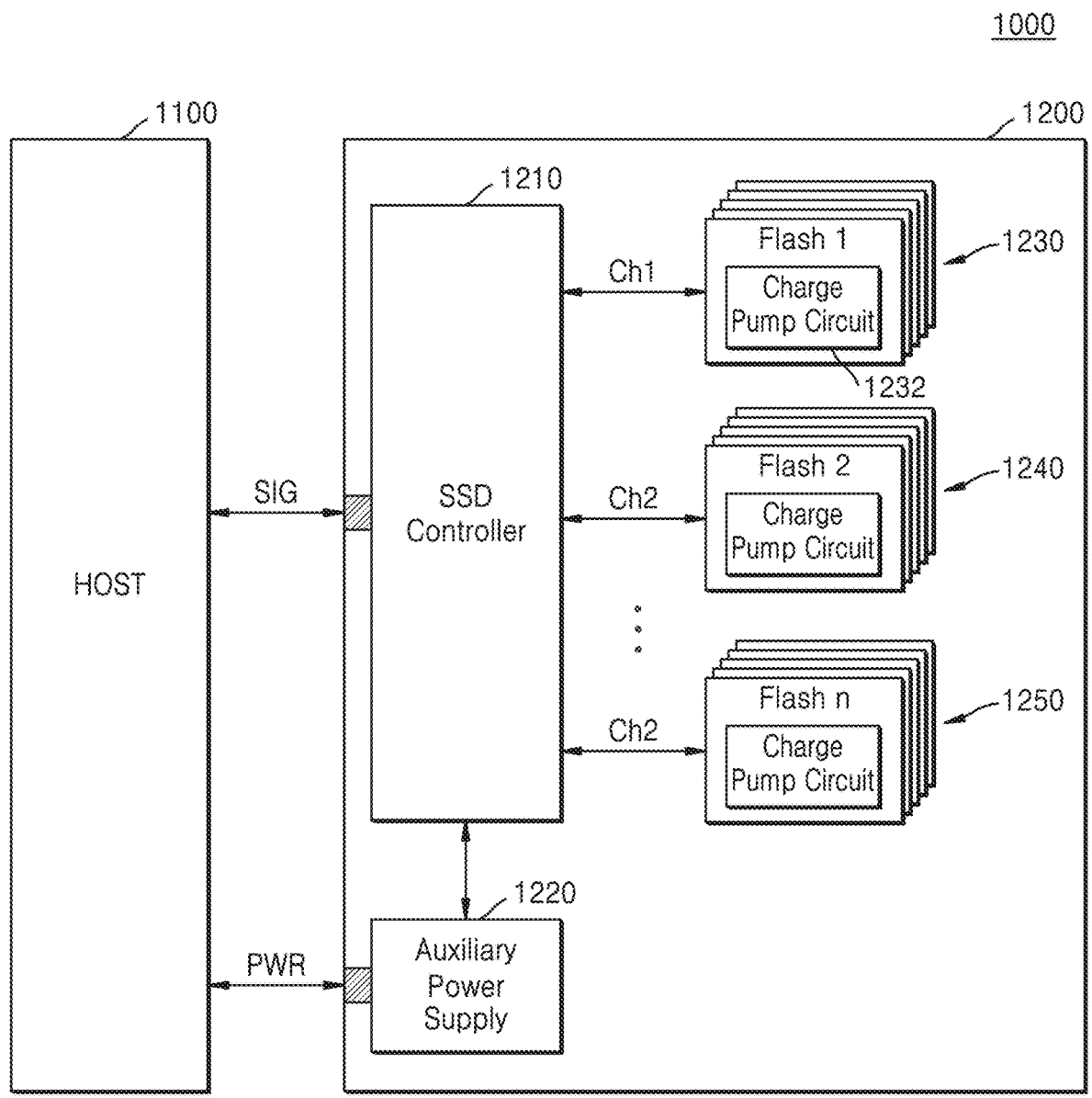
FIG. 13 is a block diagram illustrating an example, in which a memory device to which a charge pump circuit is adopted according to an example embodiment of the inventive concepts is applied to a solid state drive (SSD) system.

FIG. 13 is a block diagram illustrating an example, in which a memory device to which a charge pump circuit is adopted according to an example embodiment of the inventive concepts is applied to a solid state drive (SSD) system 1000.

Referring to FIG. 13, the SSD system 1000 may include a host 1100 and an SSD 1200. The SSD 1200 may transmit and receive a signal to and from the host 1100 through a signal connector SIG and may receive power through a power connector PWR. The SSD 1200 may include an SSD controller 1210, an auxiliary power supply 1220, and memory devices 1230, 1240, and 1250. At this time, the SSD 1200 may be implemented by using the above-described example embodiments with reference to FIGS. 1 to 12. Each of the memory devices 1230, 1240, and 1250 may include a charge pump circuit 1232 and a stage controller for controlling a stage of the charge pump circuit 1232. Therefore, the SSD system 1000 may reduce power consumption and/or may increase an operation speed in accordance with the magnitude of the pump current when the operation (e.g., one of the program operation, the read operation, and the erase operation) is performed.

While the inventive concepts have been particularly shown and described with reference to some example embodiments thereof, it will be understood that various changes in form and details may be made therein without departing from the spirit and scope of the following claims.

What is claimed is:

1. A memory device comprising:
a memory cell array including a plurality of memory cells; and
a voltage generator configured to supply a voltage to the memory cell array,
wherein the voltage generator includes,
a charge pump circuit including n pump units and configured to output a pump voltage and a pump current in accordance with a number of pump units, among the n pump units, that have received an input voltage, n being a natural number equal to or greater than 2,
a switching circuit configured to output the pump voltage, and
a stage controller configured to receive an input signal corresponding to the pump current and perform a stage control operation, the stage control operation including generating a stage control signal, the stage control signal being a signal for controlling the number of pump units among the n pump units.

2. The memory device of claim 1,
wherein the charge pump circuit further includes n voltage switches configured to selectively apply the input voltage to a corresponding one or more of the n pump units, respectively, and
wherein the n voltage switches are configured to be switched on in response to the stage control signal.

3. The memory device of claim 1, wherein the stage controller comprises:
a pump current copy circuit configured to receive the input signal corresponding to the pump current and generate a copy voltage corresponding to the pump current;
a pump current detector configured to output a reference signal based on the copy voltage and a reference voltage; and
a stage control signal generator configured to generate the stage control signal based on the reference signal.

4. The memory device of claim 3, wherein the pump current copy circuit includes a variable resistor connected to a ground power source.

5. The memory device of claim 3, wherein the pump current detector is configured to output the reference signal based on the copy voltage, a first reference voltage, and a second reference voltage having a lower level than the first reference voltage.

6. The memory device of claim 1, wherein the stage control signal comprises a stage up signal for increasing the number of pump units and a stage down signal for reducing the number of pump units.

7. The memory device of claim 1, further comprising:
a pump clock generator configured to provide a pump clock signal to the charge pump circuit,
wherein the stage controller is further configured to generate a clock control signal for controlling the pump clock generator based on the input signal corresponding to the pump current.

8. The memory device of claim 7, wherein the pump clock generator is further configured to vary a frequency of the pump clock signal in accordance with the clock control signal.

9. The memory device of claim 1, wherein the stage controller is further configured to terminate the stage control operation when a stage controller control signal is received from an outside of the stage controller.

10. The memory device of claim 1, wherein the stage controller is further configured to perform an operation of detecting an error generated in one of the memory cell array or the voltage generator based on the input signal corresponding to the pump current when a stage controller control signal is received from an outside of the stage controller.

11. The memory device of claim 10, wherein the stage controller control signal is input to the stage controller when a program operation for the memory cells is completed.

12. A memory device comprising:
a charge pump circuit including a plurality of pump units and configured to output a pump voltage and a pump current in accordance with a number of pump units that have received an input voltage among the plurality of pump units;
a switching circuit configured to output the pump voltage and the pump current; and
a stage controller configured to receive an input signal corresponding to the pump current from the switching circuit, and generate a stage control signal for controlling a stage of the charge pump circuit,
wherein the memory device is configured to increase the number of pump units as the stage of the charge pump circuit increases.

13. The memory device of claim 12,
wherein the charge pump circuit further includes voltage switches configured to selectively apply the input voltage to corresponding one or more of the plurality of pump units, respectively, and
wherein the voltage switches are configured to be switched on in response to the stage control signal.

14. The memory device of claim 12, wherein the stage controller comprises:
a pump current copy circuit configured to receive the input signal corresponding to the pump current and generate a copy voltage corresponding to the pump current;
a pump current detector configured to output a reference signal based on the copy voltage and a reference voltage; and
a stage control signal generator configured to generate the stage control signal based on the reference signal.

15. A memory device comprising:
a charge pump circuit including a plurality of pump units and configured to output a pump voltage and a pump current; and
a stage controller configured to perform a stage control operation of controlling a number of pump units to be driven among the plurality of pump units,
wherein the stage controller includes,
a pump current copy circuit configured to receive an input signal corresponding to the pump current and generate a copy voltage corresponding to the pump current,
a pump current detector configured to output a reference signal based on the copy voltage and a reference voltage, and
a stage control signal generator configured to generate a stage control signal for controlling a stage of the charge pump circuit based on the reference signal.

16. The memory device of claim 15, further comprising:
a pump clock generator configured to provide pump clock signals having different frequencies to the charge pump circuit,
wherein the stage control signal generator is further configured to receive the input signal corresponding to the pump current and generate a clock control signal for controlling the pump clock generator.

17. The memory device of claim 15, wherein the stage controller is configured to terminate the stage control operation and perform an error detection operation for detecting a fail memory cell based on the input signal corresponding to the pump current when a stage controller control signal is received from an outside of the stage controller.

18. The memory device of claim 17, wherein the stage control signal generator is further configured to output an error detection signal based on the reference signal.

19. The memory device of claim 17,
wherein the pump current copy circuit includes a variable resistance connected to a ground power source, and
wherein a first value of the variable resistance when the fail detection operation is performed is greater than a second value of the variable resistance when the stage control operation is performed.

20. The memory device of claim 17, wherein a first level of the reference voltage when the error detection operation is performed is lower than a second level of the reference voltage when the stage control operation is performed.

* * * * *